United States Patent
O'Flynn

(10) Patent No.: US 9,429,624 B2
(45) Date of Patent: Aug. 30, 2016

(54) SYNCHRONOUS SAMPLING OF INTERNAL STATE FOR INVESTIGATION OF DIGITAL SYSTEMS

(71) Applicant: Colin Patrick O'Flynn, Halifax (CA)

(72) Inventor: Colin Patrick O'Flynn, Halifax (CA)

( * ) Notice: Subject to any disclaimer, the term of this patent is extended or adjusted under 35 U.S.C. 154(b) by 99 days.

(21) Appl. No.: 14/255,924

(22) Filed: Apr. 17, 2014

(65) Prior Publication Data

US 2015/0301109 A1    Oct. 22, 2015

(51) Int. Cl.
  *G06F 7/02* (2006.01)
  *H04M 13/00* (2006.01)
  *G01R 31/319* (2006.01)
  *G01R 31/28* (2006.01)
  *G01R 31/317* (2006.01)
  *H03M 1/08* (2006.01)

(52) U.S. Cl.
  CPC ....... *G01R 31/3191* (2013.01); *G01R 31/2851* (2013.01); *G01R 31/31707* (2013.01); *G01R 31/31726* (2013.01); *H03M 1/08* (2013.01)

(58) Field of Classification Search
  CPC .......... G01R 31/3191; G01R 31/2851; G01R 31/31707; G01R 31/31726
  See application file for complete search history.

(56) References Cited

U.S. PATENT DOCUMENTS

| | | | |
|---|---|---|---|
| 2002/0107670 A1* | 8/2002 | Sugai | G01R 13/345 702/189 |
| 2004/0107376 A1* | 6/2004 | Mar | H03L 7/087 713/400 |

* cited by examiner

*Primary Examiner* — Sam Rizk

(57) ABSTRACT

Methods and apparatus are provided for sampling an indicator of the internal state of an embedded system or integrated circuit, where the indicator is sampled in a manner synchronous to the internal clock of the embedded system or integrated circuit. The resulting samples can be used for determining secret data within the embedded system or integrated circuit, detecting failures, or detecting counterfeit devices.

18 Claims, 7 Drawing Sheets

SYNCHRONOUS SAMPLING OF INTERNAL STATE FOR INVESTIGATION OF DIGITAL SYSTEMS

FIELD OF THE INVENTION

The present invention relates to analysis of digital embedded systems and in particular to measurement of power, current, or electromagnetic emissions of a digital embedded system to determine information about the structure of or data used in the operation of said digital embedded system.

BACKGROUND

As a digital device operates on data, it will use differing amounts of power depending on the data. As a simple example, setting all the lines of a data bus to '1' (i.e. VCC) will take more power from the VCC rail than setting all the lines to '0' (i.e. GND). The use of this knowledge to break cryptographic devices was proposed by Kocher, P., Jaffe, J., and Jun, B. in 'Differential power analysis' published in the proceedings of CRYPTO '99, 1999.

The application of these algorithms requires an Analog-To-Digital (ADC) converter, which digitizes the measurement related to the internal state of the Device Under Test (DUT). An example of a measurement related to the internal state of the DUT is the power being consumed by the DUT. The ADC is driven by a sample clock that determines when samples will be taken. This sample clock is typically a crystal oscillator running a a known rate, for example causing the ADC to sample at 500 million samples per second (MS/s). This sample rate is typically much greater than the clock rate of the digital device—it is demonstrated in 'Embedded Systems Security: An Evaluation Methodology Against Side Channel Attacks' by Souissi, Y., Danger, J.-L., Guilley, S., Bhasin, S., and Nassar, M. published in the proceedings of the 2011 Conference in Design and Architectures for Signal and Image Processing (DASIP), that attacking a 24 MHz hardware device may require a sample clock of 1000 MHz (i.e. 1000 MS/s) to successfully determine the internal state of the device.

If the clock of the DUT changes with time, additional work is required to temporally align the measurements. The clock frequency of the DUT may vary due to random changes over time, or it may be varied as a countermeasure to prevent someone from determining the secret information by monitoring the indicator of the internal state, as taught in U.S. Pat. No. 6,381,699. A variety of publications aim to teach methods of solving the problem of a varying clock frequency of the DUT via post-processing the recorded samples, two recent examples are 'On Clock Frequency Effects in Side Channel Attacks of Symmetric Block Ciphers' by Tian, Q., and Huss, S. A., published in The Proceedings of the New Technologies, Mobility and Security (NTMS) International Conference in May 2012, and 'Improving Differential Power Analysis by Elastic Alignment' by Van Woudenberg, J., Witteman, M., and Bakker, B., Published in proceedings of the Cryptographer's Track at RSA Conference (CT-RSA) 2011.

The injection of glitches can also cause faults in embedded systems. The fault must be carefully timed to occur at a sensitive moment in the operation of the device, for example causing it to skip execution of an instruction which checks for the proper password. The fault can be timed based on a specific pattern in the state indicator measurement performed on the DUT, indicating the DUT is executing some code which a glitch should be inserted into. Performing the measurement of the internal state indicator, such as the current usage by the DUT, must be done at a very high rate to ensure good temporal alignment of the inserted glitch to execution of the sensitive code.

BRIEF SUMMARY

The state of the art instruments which are used in analysis of embedded hardware devices are typically performing measurements relative to a timebase internal to the measurement equipment. A significant improvement in performance and reduction in cost can be achieved by using the clock inside the embedded hardware device under test (DUT) as the timebase. This requires an apparatus which is ca-pable of detecting and phase-locking to the clock signal from the DUT, which may be internal to an integrated circuit. This recovered clock signal can then be used as a sample clock for an Analog to Digital Converter (ADC), or to synchronize the injection of glitches into the embedded hardware device.

The use of the recovered clock signal results in an accurate synchronization of either measurements or signal injections to the DUT being analysed. Instead of having samples with 'timestamps' relative the clock of the measurement equipment, the samples are recorded relative to the 'clock cycle' of the DUT being analysed.

The use of a synchronized timebase has many advantages in this field. When an asynchronous timebase is used, which simply runs at a certain known frequency as in standard oscilloscopes or pulse generators, it must operate at a much higher frequency than the DUT. It is demonstrated in 'Embedded Systems Security: An Evaluation Methodology Against Side Channel Attacks' by Souissi, Y., Danger, J.L., Guilley, S., Bhasin, S., and Nassar, M. published in the proceedings of the 2011 Conference in Design and Architectures for Signal and Image Processing (DASIP), that when performing differential power analysis (DPA) on a Field Programmable Gate Array (FPGA), which is the DUT being analysed by Souissi et al., is running at a 24 MHz clock frequency, the oscilloscope sample clock must run at 1000 MS/s. Yet performing the same experiment where analog samples are taken from a 24 MHz clock which is phase-locked to the FPGA clock, the analysis also succeeds, despite the sampling rate being only 24 MS/s. Thus we can greatly reduce the requirements on the ADC sample speed and resultant data processing requirements.

The generation of the sample clock from the digital embedded system may have many embodiments. Examples of possible embodiments includes using a physical connection from an available oscillator on the DUT, performing clock recovery based on power or current measurements from the DUT, or performing clock recovery on electromagnetic emissions from the DUT.

Additional processing on the recovered clock may also be present before using this clock as the sample clock. Such processing may include adding adjustable phase shifts, multiplying or diving the clock frequency, passing through a phase-locked loop, or removing glitches from the clock.

The state indicator measured with a synchronous sample clock can also be used to form a 'signature', to detect changes in the digital device. For example the digital device can be requested to perform a certain operation, and the selected state indicator signature is recorded. Later the device, being either the same device or perhaps a replacement due to service, is asked to perform the same operation, and a new signature recorded. It would be expected the signatures of the new and old device is the same. If they differ significantly it could be that the device was replaced with a counterfeit device, or the device has been damaged.

The injection of glitches such as clock glitches or power supply glitches is also useful when attacking a DUT. These glitches must occur at a known time during the execution of code by the embedded device. Using the synchronous sampling technique with clock recovery for determining when the processor is executing some vulnerable code reduces the length of data which must be stored, while also making the system more robust against changes in the clock frequency of the DUT.

Examples of uses of this invention include performing differential power analysis to determine secret encryption keys, synchronizing to internal operations in the system for injection of glitches, reverse engineering of code by comparing signatures of power usage, detection of counterfeit integrated circuits, and detection of failing integrated circuits.

BRIEF DESCRIPTION OF THE DRAWINGS

For a more complete understanding of the invention, reference is made to the following description and accompanying drawings, in which.

DETAILED DESCRIPTION

Figure 1:
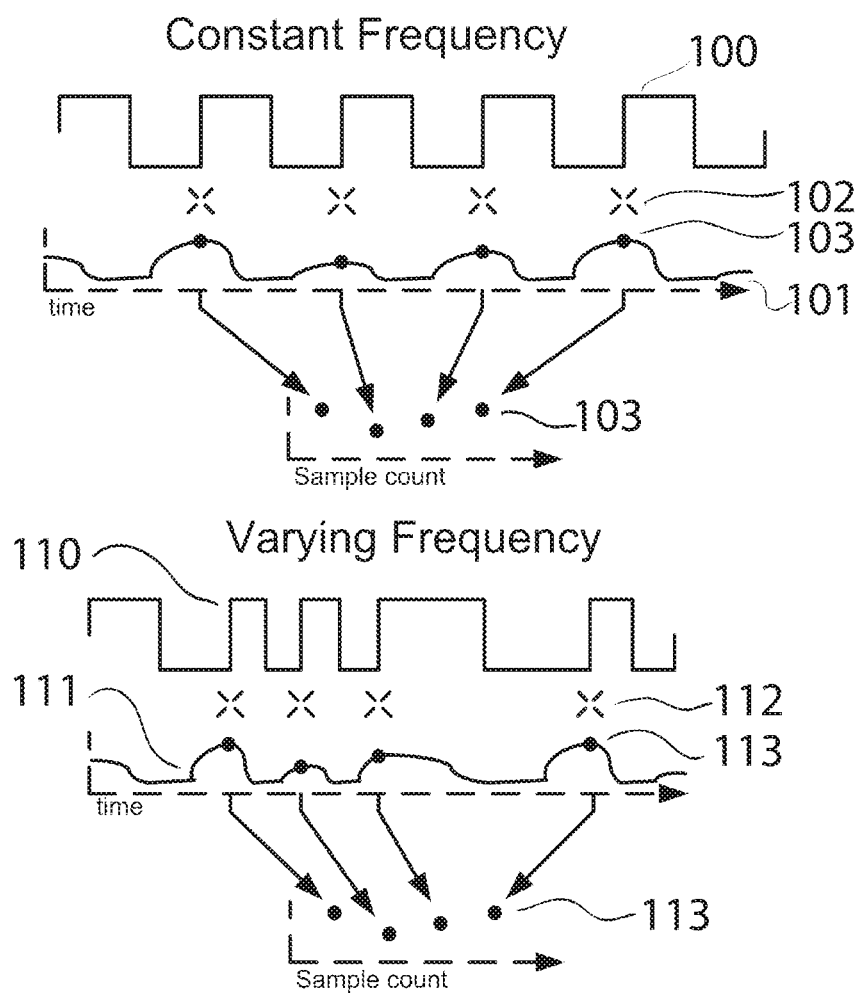
FIG. 1 demonstrates how synchronous sampling of the indicator of internal state removes dependence on time.

In FIG. 1 an example is shown where it is desired to measure the power consumption 101 of a digital device, where the digital device is clocked by clock 100. The power consumption provides an indicator of the internal state of the device, as when more power is used it is assumed more data lines are in the '1' state. In this example power is only used on the rising clock edge, real digital devices will have more complex power signatures. This invention provides a way of measuring this internal state indicator, such as the power consumption 101, in a manner which maintains the temporal relationship of a sample point 103 to a specific clock cycle.

We reuse the clock 100 to trigger the plurality of digital samples, the plurality of trigger locations being marked as 102. We can then record a plurality of samples 103, where each sample is associated with a clock cycle.

The same digital system is shown where the frequency of clock 110 varies with time. The power consumption 111 of this device appears different from the power consumption 101 of the device with a constant clock frequency. Again consider that we use the clock of the digital device to determine where the plurality of sample locations 112 are located, resulting in the plurality of samples 113. The result is that since both our samples 103 and 113 are associated with a specific clock cycle, and not a time reference, they can easily be compared. In this example the final samples 103 and 113 provide the same information for the same device under test (DUT), even if that DUT is operating at different frequencies. Before comparing measurements 103 and 113, they may require standard processing such as normalization by measurement standard deviation or normalization by measurement mean, as would be apparent to those skilled in the art. Attempting to compare the original power consumptions 101 and 111 would fail, as they cannot be temporally aligned. The use of the sample clock derived from the device clock has eliminated the problem of temporal alignment.

Figure 2:
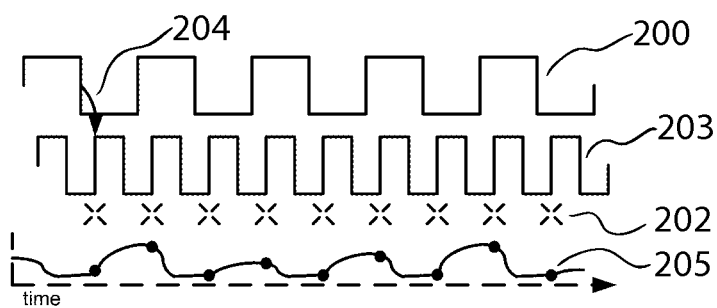
FIG. 2 demonstrates how the sampling clock can have an arbitrary phase shift or frequency multiplication and still perform the synchronous sampling.

The samples need not occur exactly on the edge of the clock from the digital device. In FIG. 2 another embodiment is shown, where the sample clock 203 is derived from the device clock 200. The sample clock 203 in this embodiment is a multiple of the device clock 200, and also has a phase shift 204 compared to the device clock 200. It can be noted how the plurality of sample times 202 are consistent with the rising edges of the sample clock 203, used to generate the plurality of samples 205. These embodiments of the invention maintain a known temporal relationship between sample point 202 to a clock cycle, or portion of the clock cycle.

Figure 3:
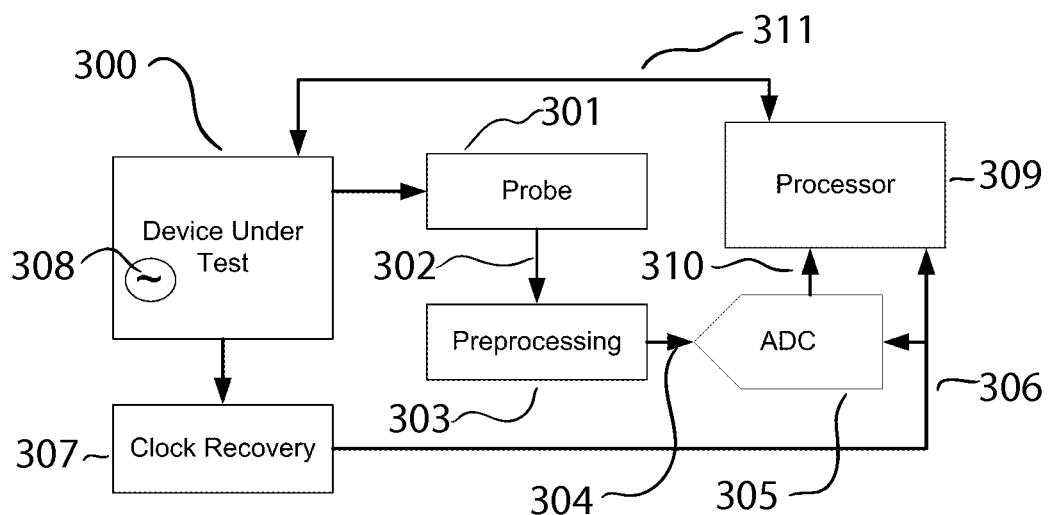
FIG. 3 is one possible embodiment of the invention, where clock recovery is used for synchronous sampling of an internal state indicator.

One embodiment of the apparatus which performs the measurements is detailed in FIG. 3. The Device Under Test (DUT) 300 is an integrated circuit, microcontroller, cryptographic accelerator, or other embedded digital system. The indicator of the internal state of the DUT 300 is measured by the probe 301 which provides an analog signal output which has a relation to the internal state of the DUT 300. Possible embodiments of probe 301 include a resistive shunt, an electromagnetic probe, an antenna, a coil of wire, and a current transformer. The output of the probe 302 will require analog processing 303 to make the signal 304 suitable for measurement by the ADC 305. Possible analog processing to be applied includes amplification, frequency selective filtering, demodulation, and differential conversion as required by the ADC 305 or probe 301. The ADC 305 is responsible for sampling this analog signal, the temporal location of sample points being selected by the sample clock 306. The sample clock 306 is created by the clock recovery block 307. The sample clock 306 has a known or constant phase relationship to the device clock 308. The digital processor 309 receives the digital samples 310 from the ADC 305. The digital processor 309 may also have a connection to the communication lines 311 of the DUT 300.

The arrangement shown in FIG. 3 is designed to be used when the clock 308 from the DUT 300 may be hidden, or the emission of this clock by the DUT is not specifically for the purpose of performing clock recovery on a communications receiver.

Possible embodiments of the clock recovery block 307 are shown in FIG. 4-FIG. 8. These blocks may be interconnected in a variety of manners to form additional embodiments of the clock recovery block 307.

Figure 4:
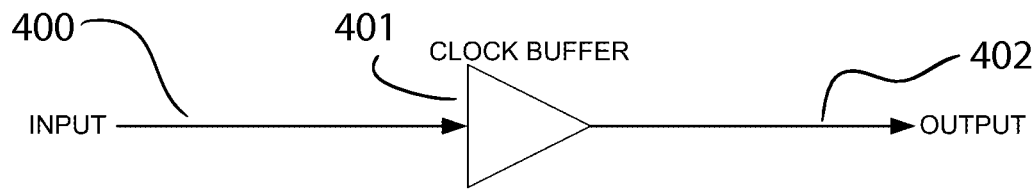
FIG. 4 is one possible embodiment of the clock recovery block, using a clock buffer.

In FIG. 4 a clock 400 is readily available from the DUT, and buffered using a clock buffer 401 to drive the ADC with a buffered version of the clock 402.

Figure 5:
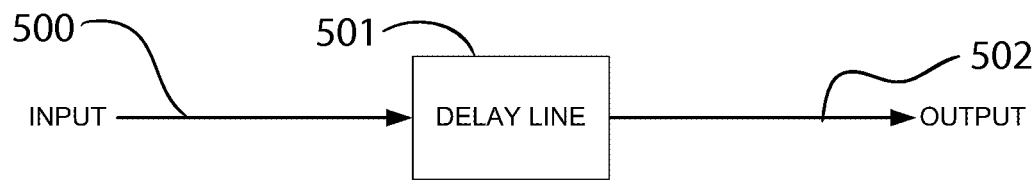
FIG. 5 is one possible embodiment of the clock recovery block, using a delay line to adjust the phase.
Figure 6:
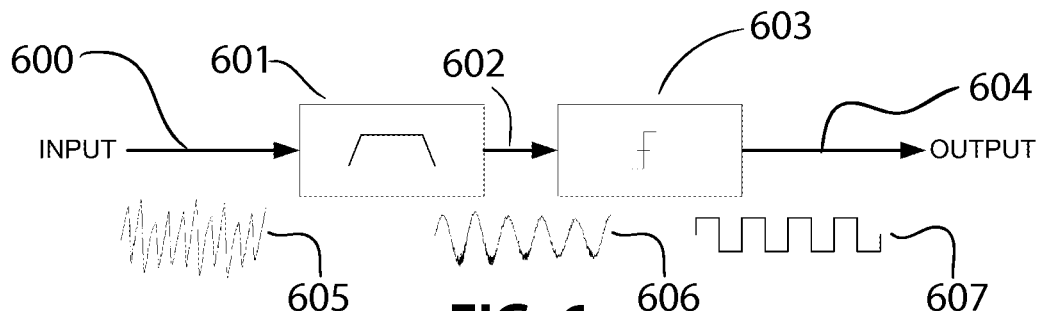
FIG. 6 is one possible embodiment of the clock recovery block, using a filter and limiter.

It may be necessary to add a delay using the apparatus in FIG. 5, using the adjustable delay line 501, such that the sample clock 502 has a known offset or phase difference from the DUT clock 500.

Where the clock is not available as a digital signal on the DUT 300, it may be necessary to recover the clock from emissions or measurements from the DUT 300, as in FIG. 6. The input 600 is an emission or measurement from the DUT 300, and may be for example the state measurement from 302 or 304, or some other measurement specifically selected for clock recovery. These emissions are first filtered using frequency selective filter 601, which is selected to pass only frequencies around the operating frequency of the device. This filter 601 should be selected for flat phase response in order to avoid adding unexpected delay into the recovered clock. The output of the filter 602 is passed through a limiter 603 which converts the signal into a digital clock signal 604. In addition filter 601 may include pre or post amplifies as required by the limiter 603.

Example waveforms for one embodiment of FIG. 6 are shown as well. In one embodiment the input waveform 600 is shown in 605, which is the measurement across a resistive shunt inserted into the power line of a microcontroller. The filter 601 in this embodiment is configured to be a Bessel bandpass filter with a passband around the operating frequency of the microcontroller, in this example being in the range of 5-8 MHz. The output of the filter appears as 606, which is a sine wave at the fundamental operating frequency of the microcontroller. The limiter 603 finally converts the output 606 to the digital square wave 607, which maintains a phase relationship to the clock of the microcontroller from which the measurements 605 were taken.

Many aspects of the design of the filter 601 are available for configuration. The type of filter, implementation of filter, and frequency response of the filter are all parameters which can be adjusted depending on specific requirements of the implementation. The phase response or group delay of the filter is particularly important in this application. If the operating frequency of the DUT is changing widely, the delay through the filter will vary, the amount of variation changing for different filter implementation choices. This delay means there will be a varying phase difference between the clock 308 of the DUT and the ADC sample clock 306. The delay can be compensated for either via a control loop adjusting the phase delay of the ADC sample clock 306, for example using a delay line 501, or by digital means inside the processor 309.

The examples here have mainly considered that filter 601 is a passive frequency-selective filter, such as an inductor-capacitor (LC) implementation of a bandpass Chebyshev or Bessel filter. There are many additional possible implementation, and the filter may instead be an active circuit, or include a control loop such as in a tracking filter, with the objective of tracking a widely changing clock frequency. Such details are well known to those skilled in the art, and one is referred to any standard filter design textbook for further information.

Figure 7:
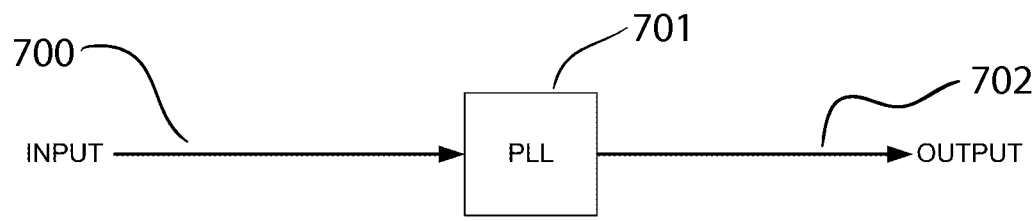
FIG. 7 is one possible embodiment of the clock recovery block, using a phase locked loop (PLL).

In FIG. 7, the input clock 700 is passed through a Phase Locked Loop (PLL) 701. The PLL regenerates the input clock, but maintains a known phase relationship between the input 700 and the output 702. This PLL block may be necessary to eliminate glitches or reduce jitter in a clock. The PLL can also be used to provide a clock that is a multiple of the sample clock. For example if a DUT is running at 24 MHz, it may be desired to sample the power used by the DUT at 96 MHz. In this example the PLL would be configured to multiply the DUT clock by 4×, while maintaining the correct phase relationship. If only frequency multiplication is required, alternatives to the PLL can be inserted in 701 such as a Delay Locked Loop or similar.

Figure 8:
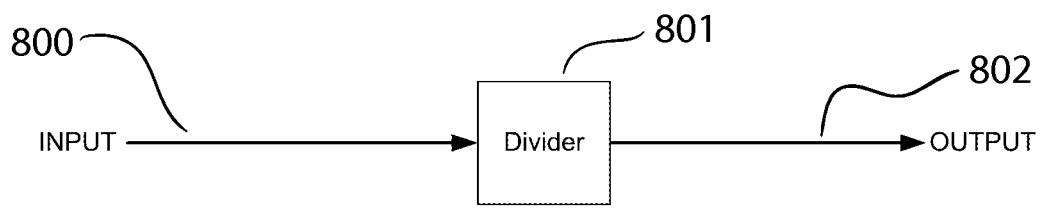
FIG. 8 is one possible embodiment of the clock recovery block, using a clock divider.

In FIG. 8, the input clock 800 is divided by block 801 to form a slower clock 802.

It is possible to interconnect blocks in FIG. 4, FIG. 5, FIG. 6, FIG. 7, and FIG. 8 in a variety of manners to form the clock recovery block 307. One possible embodiment would use the state measurement 302, and passes it through the filter and limiter in FIG. 6. The output 604 of this block is then passed to the PLL in FIG. 7. The output 702 of the PLL is finally passed to the ADC as the sample clock 306. Another embodiment would be to use blocks in FIG. 4, where the clock from the DUT is directly available, and a buffered version of the clock 402 is passed through the delay line 501. The output 502 of the delay line becomes the ADC sample clock 306. Many possible embodiments of the clock recovery block can be designed by those skilled in the art.

The digital processor 309 also has access to the sample clock 306. The digital processor may simply record the samples 310 to memory for further processing by a software algorithm, or may process the data in real-time. One possible embodiment of the digital processor 309 is a memory buffer, where further processing is performed by another device such as a general-purpose computer connected to the digital processor 309. The digital processor may alternatively be defined to encompass both the memory buffer and the general-purpose computer. Another embodiment of the digital processor 309 is one where an embedded computer is performing the entire software algorithm, and no separate general-purpose computer is present. Yet another embodiment of the digital processor 309 is one where it is part of a larger integrated circuit or embedded system.

The innovation of using the sample clock 306 which is synchronized to the DUT clock 308 means that less data is required by the digital processor 309, since the sample clock 306 can run much slower than when the sample clock 306 is not synchronized to the DUT clock 308. The synchronized nature of the sampling clock 306 guarantees the digital processor 309 is sampling exactly at the point of interest, that is some known or repeatable time offset from a clock edge of the DUT clock 308.

The reduced speed of the sample clock 306 has many commercial benefits. The cost and power consumption of the ADC 305 and processing block 309 is greatly reduced due to the slower speed of the sample clock. In addition less samples are required to cover an equivalent number of clock cycles of the DUT.

The digital processor 309 may use the sampled data for a variety of purposes. Existing algorithms such as the Differential Power Analysis (DPA) attack by Kocher et al. can be applied for breaking of cryptographic devices such as cryptographic algorithms implemented in a microcontroller, or hardware cryptographic accelerators.

Figure 9:
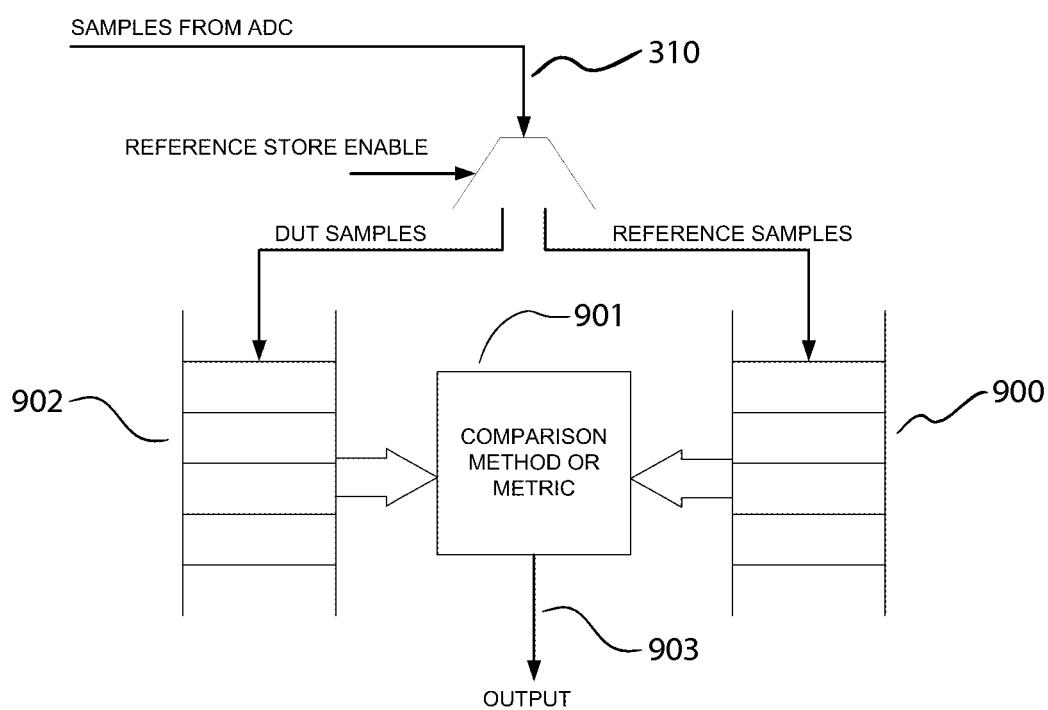
FIG. 9 is one possible embodiment of a digital processor which has a stored plurality of samples of the internal state indicator, and continuously compares it to measurements from the Device Under Test (DUT).

Another embodiment of the digital processor 309 is one configured to allow detection of a known pattern in the input signal, a possible embodiment of this detection system is shown in FIG. 9. The apparatus records samples 310 as reference 900 when it is known the DUT 300 is performing an operation of interest. Later the digital processor 309 compares new samples 310 that are taken when the DUT 300 is performing unknown operations. When the samples 310 match the stored samples 900, as determined by a threshold on the output 903 of an appropriate metric 901, the digital processor can be confident the DUT 300 is performing the same operation that occurred when samples 900 where recorded. Examples of metric 901 are using correlation, sum of absolute difference, sum of square difference, or application of a probability density functions. The incoming samples 310 may be stored in a temporary register 902 as required for the comparison.

Another embodiment of the digital processor 309 is one configured to detect whether the DUT 300 is performing correctly. Again the same apparatus of FIG. 9 will be used. The samples 310 are compared against the reference samples 900 when it is known the DUT 300 is performing the same operation that was originally requested when reference samples 900 were recorded. Again using a suitable metric 901 the reference samples 900 are compared to the new samples 310. If the device is operating incorrectly or damaged, the samples may differ. A few examples of the cause of such damage include: an integrated circuit (IC) could have electro-static discharge (ESD) damage causing a change in power consumption, the device could be operating at too high or too low a temperature, the device could be operating at an incorrect frequency, or an external attacker could be attempting to introduce faults.

Figure 10:
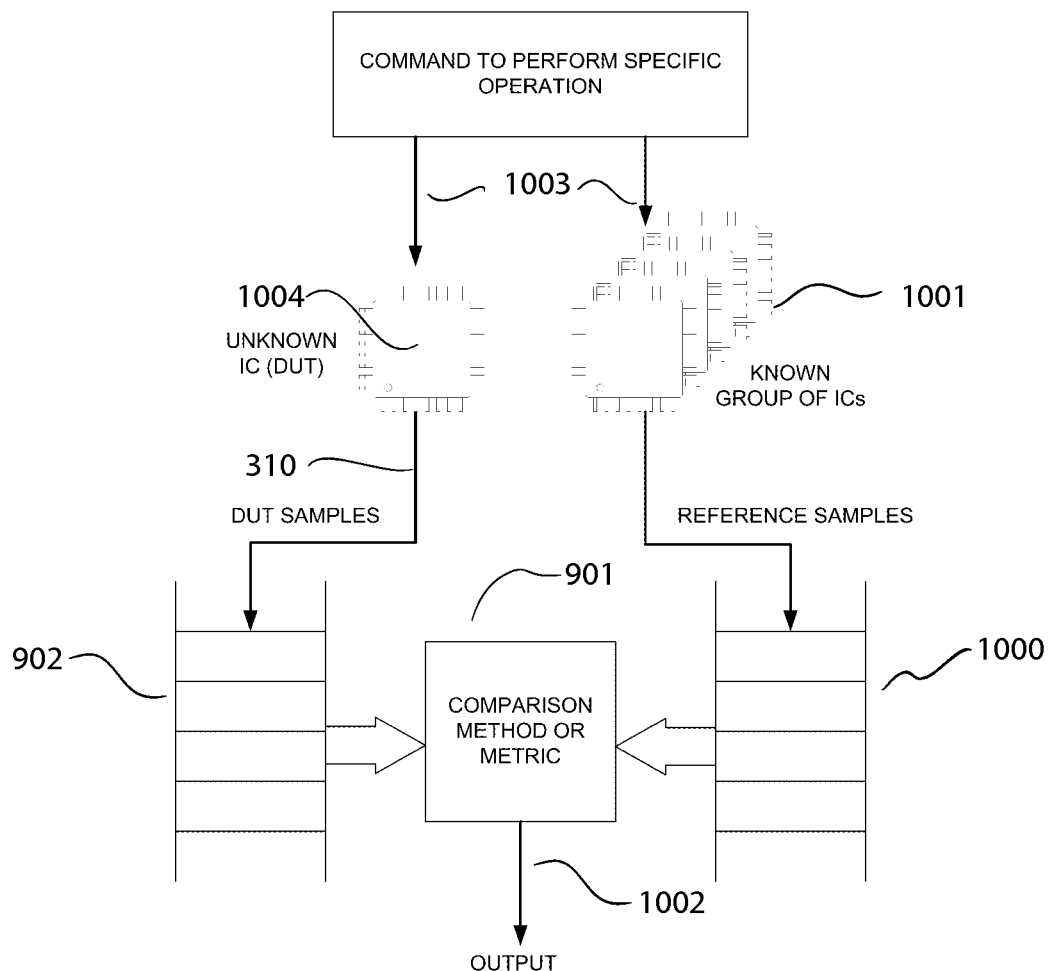
FIG. 10 is one possible embodiment of the invention being used to determine if an unknown IC or digital device has internal state consistent with another group of known ICs or digital devices.
Figure 11:
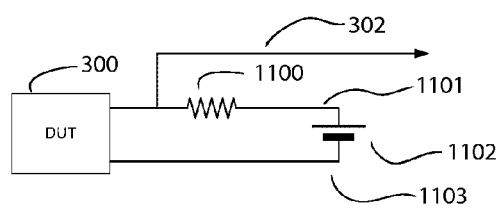
FIG. 11 is one possible embodiment of the internal state measurement probe, where a single-ended resistive shunt is used to measure current used by the Device Under Test (DUT).

Another embodiment of the digital processor 309 is one configured to determine if an unknown integrated circuit is a member of a specific group of integrated circuits. A possible embodiment of this is shown in FIG. 10. This requires that a plurality of reference samples 1000 have previously been measured over a group of correctly functioning integrated circuits 1001 while performing a certain operation 1003. It is desired to determine if DUT 1004 is also a member of this group. A comparison metric 901 is used to compare samples 310 taken from the DUT 300 while it is performing operation 1003. If the samples do not match according to metric 901, this suggests the DUT 1004 is not part of group 1001. The output 1002 of the metric 901 can be used as validation of external information or assumptions that DUT 1004 should be part of group 1001. For example, this could be used to validate parts in the supply chain to determine if they are faulty or counterfeit. Or the device can be used as part of a manufacturing test to confirm a part being tested (such as DUT 1004) conforms to expected or published specifications.

For certain algorithms the digital processor 309 may use the communications channel 311 to request the DUT 300 perform certain operations. This is not required for all cases, for example when simply determining the moment in time that a DUT 300 is performing some operation with a known reference sample pattern 900. In addition the digital processor 309 may simply be monitoring communication which is occurring between the DUT 300 and some external device. The digital processor 309 does not explicitly need to be requesting that the DUT performs certain operations, and may instead simply wait for the external device which the DUT 300 is already communicating to perform a certain command or operation.

The measurement probe 301 provides a signal which is related to the internal state of the DUT 300. The source of this signal depends on the specifics of the DUT, for example microcontrollers typically consume differing amounts of power depending on the number of bits being set to '1' on the internal bus. Thus for measurements on a microcontroller one possible indicator of the internal state would be the current being used by the device, such current being measurable using a variety of apparatus discussed next.

The probes in FIG. 11-FIG. 16 use the current being consumed by the device as the indicator of the internal state. The most basic embodiment is a resistive shunt 1100 inserted into a power line 1101 for the DUT 300, where DUT 300 has a second power line 1103 connecting it to the power source 1102. The voltage developed across the resistor will vary with power consumed by the device, and this voltage is the output 302 of the probe.

Figure 12:
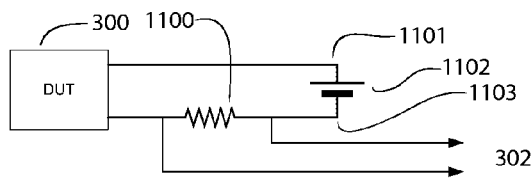
FIG. 12 is one possible embodiment of the internal state measurement probe, where a differential resistive shunt is used to measure current used by the Device Under Test (DUT).

The resistive shunt can be inserted into any power line, for example in FIG. 12 it is inserted into the other power line 1103. In addition the output of the shunt can be measured differentially as in FIG. 12, where the differential voltage is the output 302 of the probe.

Figure 13:
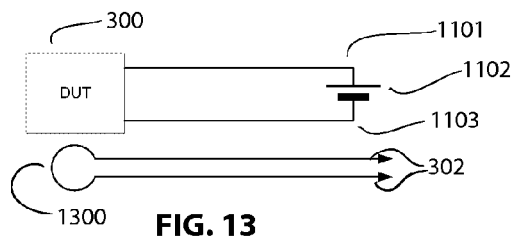
FIG. 13 is one possible embodiment of the internal state measurement probe, where an electromagnetic probe is used to measure power consumed by the Device Under Test (DUT).

Measuring the current can be done via a variety of other sensors, such as probes to detect the magnetic field resulting from a changing current, current transformers, or Hall-effect sensors. In FIG. 13 a simple loop antenna 1300 is used to measure the changing current without physically modifying the DUT 300 power lines 1101 or 1103.

Figure 14:
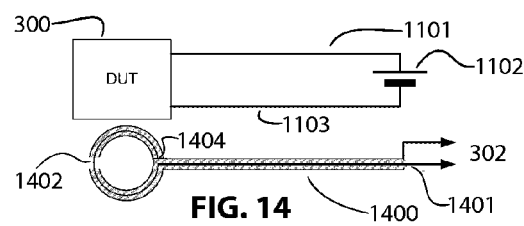
FIG. 14 is one possible embodiment of the internal state measurement probe, where a shielded magnetic-field probe is used to measure power consumed by the Device Under Test (DUT).

Various modifications and embodiments of the non-contact probe are possible, another modification is shown in FIG. 14. Here the probe has an outer coaxial conductive braid 1400 around the center conductor 1401. The outer braid 1400 and center conductor 1401 are connected at point 1404 to effectively form a loop antenna. The outer braid 1400, however, forms a shield over the antenna. A small break 1402 in the outer braid 1400 allows entry of the field to be sensed onto the center conductor 1401.

Figure 15:
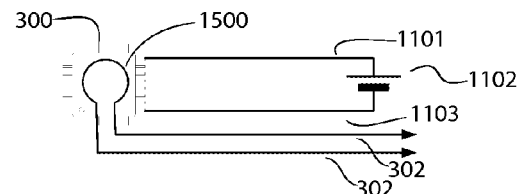
FIG. 15 is one possible embodiment of the internal state measurement probe, where a loop antenna embedded onto a circuit board or integrated circuit substrate is used to measure current consumed by the Device Under Test (DUT).

The probe can also be integrated onto an existing device such as a printed circuit board (PCB) or integrated circuit (IC) substrate. In FIG. 15 the loop antenna 1500 is mounted permanently underneath the DUT 300, the DUT in this example could be an integrated circuit mounted on a PCB.

Figure 16:
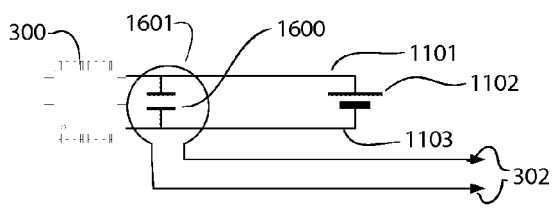
FIG. 16 is one possible embodiment of the internal state measurement probe, where a loop antenna concentrated around decoupling capacitors is used to measure current consumed by the Device Under Test (DUT).

It can be appreciated that the measurement point may not be directly connected to the DUT 300. In FIG. 16 it is demonstrated how the measurement of the current through the DUT 300, again in this example the DUT could be an integrated circuit, is taken by a measurement loop 1601 around the decoupling capacitor 1600 of the DUT.

Figure 17:
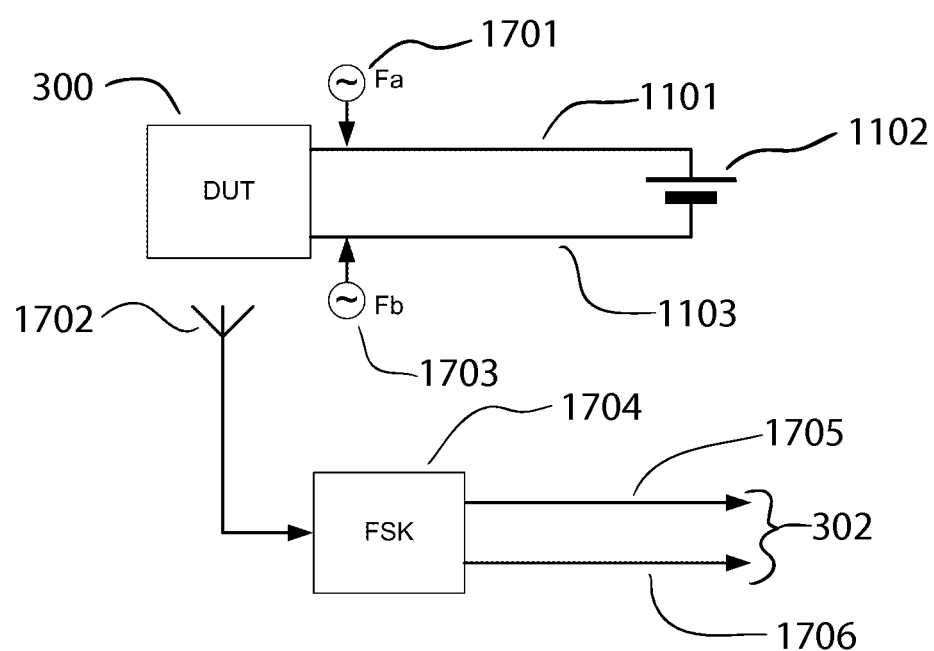
FIG. 17 is one possible embodiment of the internal state measurement probe, where external signals are injected into the Device Under Test (DUT), and the strength or other properties of these signals is detected to determine information about the Device Under Test (DUT).

Yet another possible indicator of the internal state is demonstrated in the probe of FIG. 17. This probe again shows the DUT 300 having power source 1102, with power lines 1101 and 1103. Two different frequencies are injected into the power lines: frequency $F_a$ from source 1701 is injected into power line 1101, and frequency $F_b$ from source 1703 is injected into power line 1103. An antenna 1702 is used to detect electromagnetic emissions from the DUT 300. As the DUT 300 changes states, the frequency components of the electromagnetic emissions will change. A Frequency Shift Keying (FSK) type demodulator 1704 is used to detect the portion of the emissions having the frequency $F_a$ compared to $F_b$. The two outputs 1705 and 1706 indicate the strength of emissions at frequency $F_a$ and $F_b$ respectively. These outputs form the indicator of internal state of the device 302. Many details of this embodiment will be apparent to those skilled in the art. One detail for example is the injection of the two frequencies will require additional support such as DC-blocking capacitors to allow injection on the power line 1101 and power line 1103, along with inductive beads in the power line 1101 and power line 1103 to prevent the signal 1701 and 1703 from leaking beyond the DUT 300. Another detail is the design of the antenna 1702, which take many forms, including but not limited to those taught in FIG. 13-FIG. 16. Finally the FSK demodulator 1704 could be replaced with other forms of demodulators, such as Phase-Shift Keying (PSK) or Amplitude Modulation (AM) with associated changes in the injected signals 1701 and 1703.

Many physical variations of the apparatus are possible. One possible embodiment of the apparatus is a stand-alone test tool, where the DUT 300 is a device such as an integrated circuit or embedded system, and is temporary connected to the apparatus.

Another possible embodiment is the integration of the apparatus onto an integrated circuit. In this case the DUT 300 may be simply a portion of an integrated circuit that it is desired to verify operation of, or may be a completely separate device, such as a specific integrated circuit on a printed circuit board. It would be possible to integrate all portions from FIG. 3 onto an integrated circuit die, using the taught methods on the same integrated circuit onto which the apparatus is mounted, or to verify external devices connected to said integrated circuit.

Yet another possible embodiment is the integration of the apparatus onto a printed circuit board, where the DUT 300 is also mounted on said circuit board. This can be used to verify operation of one or more integrated circuits on the circuit board. If verification of several separate DUTs is required, the connections to the DUTs can be multiplexed into the apparatus.

While exemplary embodiments of the present invention have been described with respect to standard digital and analog blocks, as would be apparent to one skilled in the art, various functions may be implemented in the digital domain as processing steps in a software program, in hardware by circuit elements or state machines, or in combinations of both software and hardware. Such software may be employed in, for example, a digital signal processor, microcontroller, or general-purpose computer. Such hardware and software may be embodied within circuits implemented within an integrated circuit.

Thus, the functions of the present invention can be embodied in the form of methods and apparatuses for practising those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practising the invention. When implemented on a general-purpose processor, the program code segments combine with the processor to provide a device that operates analogously to specific circuits.

It is to be understood that the embodiments and variations shown and described herein are merely illustrative of the principles of this invention and that various modifications may be implemented by those skilled in the art without departing from the scope and spirit of the invention.

What is claimed:

1. An apparatus for performing synchronous acquisition of an indicator of an internal state of a device under test, said device under test not configured to communicate said internal state on digital communication channels of said device under test, the apparatus comprising:
   a clock generator configured to retrieve clock data from a clock configured to execute instructions on the device under test;
   a probe configured to produce an analog signal representing an internal state of the device under test;
   an analog to digital converter coupled to the probe and configured to generate a plurality of digital samples representing the magnitude of said analog signal by performing sampling operations at times indicated by the clock generator; and
   a digital processing unit configured to receive the plurality of digital samples from the analog to digital converter.

2. The apparatus of claim 1, wherein said indicator of the internal state of said device under test is a measurement related to current being consumed by said device under test.

3. The apparatus of claim 1, wherein said clock generator comprises a buffer configured to receive a digital clock signal originating from said device under test.

4. The apparatus of claim 1, wherein said clock generator comprises a frequency selective filter combined with a limiter, wherein said frequency selective filter is configured to pass a fundamental operating frequency of said device under test, and the limiter is configured to generate a digital signal from the output of the frequency selective filter.

5. The apparatus of claim 1, wherein said clock generator comprises an adjustable oscillator, wherein a frequency of said adjustable oscillator is configured to maintain an output of said adjustable oscillator with a known or constant phase relationship to said clock of said device under test.

6. The apparatus of claim 1, wherein said clock generator is configured to provide an adjustable phase delay between the phase of said device under test clock and an output of said clock generator.

7. The apparatus of claim 1, wherein a clock generator output frequency is configured to be a multiple or division of a clock frequency of said device under test.

8. The apparatus of claim 1, wherein said device under test is positioned in an embedded system contained in said apparatus.

9. A method for performing synchronous acquisition of an indicator of an internal state of a device under test executing processor instructions, said internal state being not available over digital communication channels of the device under test, the method comprising:
   determining temporal locations of clock transitions of a clock retrieved from the device under test, said clock being used by the device under test to determine the temporal location of processor instruction execution; and generating samples of the indicator of the internal state of the device under test at a plurality of sampling points, wherein said sampling points have a known or constant temporal relation to the clock transitions.

10. The method of claim 9, further comprising performing a comparison between said generated samples and previously generated samples while said device under test was performing known operations.

11. The method of claim 10, further comprising analyzing said comparison to determine if a failure has occurred in said device under test.

12. The method of claim 10, further comprising analyzing said comparison to determine if said device under test is a counterfeit component.

13. The method of claim 10, further comprising analyzing said comparison to determine when said device under test is executing specific instructions.

14. The method of claim 9, wherein said determining of the temporal locations of clock transitions comprises:

processing said indicator of an internal state with a frequency-selective filter configured to generate a waveform with a fundamental frequency equal to a frequency of said clock of said device under test; and performing a zero-crossing detection on an output of said frequency-selective filter such that the temporal location of each zero-crossing has a known or constant temporal relation to the clock transitions of said clock used by said device under test.

15. A computer-readable storage medium that is not a transient signal, the computer readable medium having stored thereon instructions that, when executed by one or more processors, cause an apparatus to at least perform the following:

communicate with a device under test, wherein said device under is performing operations in response to communications with an apparatus or third party; and determine locations of clock transitions of a clock retrieved from the device under test, wherein the device under test is performing said operations under control of said clock; and by use of said clock transitions, cause a plurality of samples to be taken of an indicator of an internal state of said device under test, the location of said plurality of samples having a known or constant temporal relationship to the location of said clock transitions.

16. A computer-readable storage medium of claim 15, wherein said apparatus is caused to compare said plurality of samples to a database of previously stored samples.

17. A computer-readable storage medium of claim 15, wherein said apparatus is caused to determine a value of a hidden piece of data being processed by said device under test, said hidden piece of data being determined by an algorithm using said plurality of samples and data sent to or received from said device under test.

18. A computer-readable storage medium of claim 15, wherein said apparatus is caused to use said plurality of said samples to determine if said device under test is operating correctly.

* * * * *